(12) United States Patent
Yoshimoto et al.

(10) Patent No.: US 11,404,119 B1
(45) Date of Patent: Aug. 2, 2022

(54) NON-VOLATILE MEMORY DEVICE AND CHALLENGE RESPONSE METHOD

(71) Applicant: PANASONIC CORPORATION, Osaka (JP)

(72) Inventors: Yuhei Yoshimoto, Hyogo (JP); Yoshikazu Katoh, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 0 days.

(21) Appl. No.: 17/239,026

(22) Filed: Apr. 23, 2021

(51) Int. Cl.
*G11C 11/00* (2006.01)
*G11C 13/00* (2006.01)
*G11C 29/42* (2006.01)

(52) U.S. Cl.
CPC ........ *G11C 13/0069* (2013.01); *G11C 13/004* (2013.01); *G11C 13/0038* (2013.01); *G11C 13/0059* (2013.01); *G11C 29/42* (2013.01)

(58) Field of Classification Search
CPC ............ G11C 13/0069; G11C 13/0038; G11C 13/004; G11C 13/0059; G11C 29/42
See application file for complete search history.

(56) References Cited

U.S. PATENT DOCUMENTS

| 8,446,250 | B2 | 5/2013 | Kursawe et al. | |
| 8,737,115 | B2 * | 5/2014 | Yamazaki | H01L 45/1226 365/158 |
| 2010/0054019 | A1 * | 3/2010 | Toda | G11C 8/12 365/207 |
| 2012/0230085 | A1 * | 9/2012 | Kawai | H01L 45/08 365/148 |
| 2013/0058154 | A1 * | 3/2013 | Katagiri | G11C 8/10 365/148 |

(Continued)

FOREIGN PATENT DOCUMENTS

| JP | 2016-105585 A | 6/2016 |
| WO | 2610/100015 A1 | 9/2010 |
| WO | 2014/119329 A1 | 8/2014 |

OTHER PUBLICATIONS

Georgios Selimis, et al., "Evaluation of 90nm 6T-SRAM as Physical Unclonable Function for Secure Key Generation in Wireless Sensor Nodes", International Symposium on Circuits and Systems (ISCAS 2011), May 2011.

(Continued)

*Primary Examiner* — Hien N Nguyen
(74) *Attorney, Agent, or Firm* — McDermott Will & Emery LLP

(57) ABSTRACT

A non-volatile memory device includes a data generation circuit and a reconfiguration processing circuit. The data generation circuit generates: third response data that is different from the first response data (PUF registration mode), when the reconfiguration writing is executed by the reconfiguration processing circuit and the first type of challenge data is obtained again after the reconfiguration writing is executed, after the first response data is generated; and fourth response data that is identical to the second response data (permanent PUF registration mode), when the reconfiguration writing is executed by the reconfiguration processing circuit and the second type of challenge data is obtained again after the reconfiguration writing is executed, after the second response data is generated.

11 Claims, 13 Drawing Sheets

(56) References Cited

U.S. PATENT DOCUMENTS

2015/0213885 A1    7/2015   Katoh
2016/0148664 A1    5/2016   Katoh et al.
2019/0057738 A1*   2/2019   Lin ................... G11C 13/0007

OTHER PUBLICATIONS

An Chen, "Comprehensive Assessment of RRAM-based PUF for Hardware Security Applications", 2015 IEEE International Electron Devices Meeting (IEDM), 2015, pp. 10.7.1-10.7.4; Downloaded Jun. 10, 2020.

Po-Hao Tseng, et al., "Error Free Physically Unclonable Function (PUF) with Programmed ReRAM using Reliable Resistance States by Novel ID-Generation Method", 2017 International Conference on Solid State Devices and Materials, 2017, pp. 45-46.

Klaus Kursawe, et al., "Reconfigurable Physical Unclonable Functions—Enabling Technology for Tamper-Resistant Storage", 2009 IEEE International Workshop on Hardware-Oriented Security and Trust, pp. 22-29.

* cited by examiner

| | Median | 1st permanent determination value | 2nd permanent determination value |
|---|---|---|---|
| | 124 | 210 | 40 |

(b)

| Resistance value register (Measured by sense amplifier circuit) | 226 | 32 | 62 | 112 | 170 | 228 | 145 | 110 | 92 | 136 | 107 | 245 | 88 | 169 | 253 | 15 |
|---|---|---|---|---|---|---|---|---|---|---|---|---|---|---|---|---|
| PUF data (Generated by comparing with median) | 1 | 0 | 0 | 0 | 1 | 1 | 1 | 0 | 0 | 0 | 0 | 1 | 0 | 1 | 1 | 0 |

(c)

| Permanent information data (Generated by comparing with 1st permanent determination value and 2nd permanent determination value) | 1 | 1 | 0 | 0 | 0 | 1 | 0 | 0 | 0 | 0 | 0 | 1 | 0 | 0 | 1 | 1 |
|---|---|---|---|---|---|---|---|---|---|---|---|---|---|---|---|---|

NON-VOLATILE MEMORY DEVICE AND CHALLENGE RESPONSE METHOD

FIELD

The present disclosure relates to a non-volatile memory device including a plurality of variable resistance non-volatile memory cells and having tamper resistance, and a challenge response method using the non-volatile memory device.

BACKGROUND

The market for electronic commerce services such as online banking and online shopping that are conducted via the Internet is expanding rapidly. Electronic money is used as a payment method at this time, and the use of IC ("Integrated Circuit", the same applies hereinafter) cards and smartphone terminals used as the medium is also expanding in the same manner. For security at the time of payment, these services always require a higher level of security technology for mutual authentication in communication and encryption of communication data.

Regarding software technology, encryption technology for program processing centered on advanced encryption algorithms has been accumulated, and sufficient security has been achieved. However, due to technological advances, there is a rapidly growing concern that information inside circuits can be read directly from the outside through hardware.

CITATION LIST

Patent Literature

PTL 1: Japanese Unexamined Patent Application Publication No. 2016-105585
PTL 2: International Publication No. 2014/119329
PTL 3: U.S. Pat. No. 8,446,250
PTL 4: International Publication No. 2010/100015

Non Patent Literature

NPL 1: Georgios Selimis, et al. "Evaluation of 90 nm 6T-SRAM as Physical Unclonable Function for Secure Key Generation in Wireless Sensor Nodes"
NPL 2: An Chen, "Comprehensive Assessment of RRAM (registered trademark)-based PUF for Hardware Security Applications" IEDM2015
NPL 3: P. H. Tseng, et al. "Error Free Physically Unclonable Function (PUF) with Programmed ReRAM using Reliable Resistance States by Novel ID-Generation Method" SSDM2017
NPL 4: Klaus Kurasaswe, "Reconfigurable Physical Unclonable Functions—Enabling Technology for Tamper-Resistant Storage"

SUMMARY

Technical Problem

The present disclosure provides a non-volatile memory device with high tamper resistance and a challenge response method.

Solution to Problem

The non-volatile memory device in one aspect of the present disclosure is a non-volatile memory device, including: a memory cell array including a plurality of variable resistance memory cells; a data generation circuit that generates response data using the memory cell array when challenge data is obtained; and a reconfiguration processing circuit that executes reconfiguration writing that applies a voltage pulse to the memory cell array at least once, wherein the data generation circuit generates: first response data that is unique to the non-volatile memory device, when a first type of challenge data is obtained; second response data that is unique to the non-volatile memory device, when a second type of challenge data is obtained; third response data that is different from the first response data, when the reconfiguration writing is executed by the reconfiguration processing circuit and the first type of challenge data is obtained again after the reconfiguration writing is executed, after the first response data is generated; and fourth response data that is identical to the second response data, when the reconfiguration writing is executed by the reconfiguration processing circuit and the second type of challenge data is obtained again after the reconfiguration writing is executed, after the second response data is generated.

The challenge response method in one aspect of the present disclosure is a challenge response method of generating response data corresponding to challenge data by a non-volatile memory device that includes a memory cell array including a plurality of variable resistance memory cells, the challenge response method including: generating the response data using the memory cell array when the challenge data is obtained; and performing reconfiguration processing to execute reconfiguration writing in which a voltage pulse is applied to the memory cell array at least once, wherein the generating includes: generating first response data that is unique to the non-volatile memory device, when a first type of challenge data is obtained; generating second response data that is unique to the non-volatile memory device, when a second type of challenge data is obtained; generating third response data that is different from the first response data, when the reconfiguration writing is executed in the reconfiguration processing and the first type of challenge data is obtained after the reconfiguration writing is executed, after the first response data is generated; and generating fourth response data that is identical to the second response data, when the reconfiguration writing is executed in the reconfiguration processing and the second type of challenge data is obtained after the reconfiguration writing is executed, after the second response data is generated.

Advantageous Effects

The present disclosure provides a non-volatile memory device with high tamper resistance and a challenge response method.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 18 is a diagram showing a specific example of data used for generating permanent PUF data by the non-volatile memory device in the embodiment.

Figure 1:
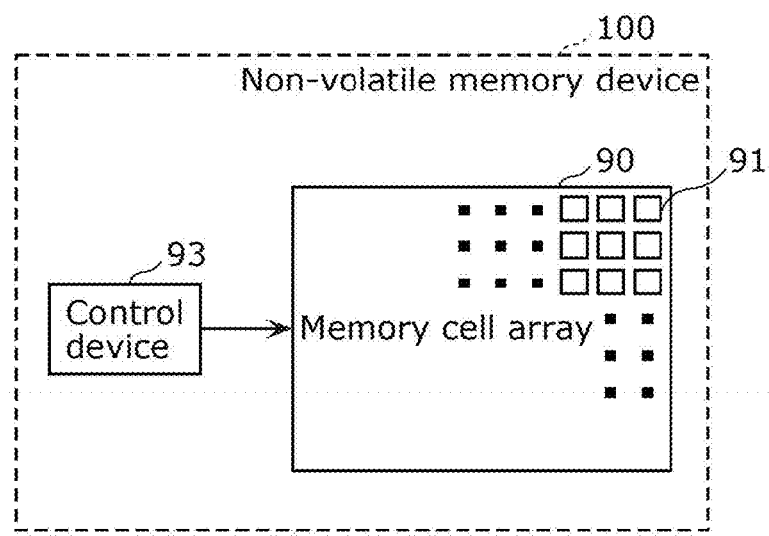
FIG. 1 is a block diagram showing an example of a schematic configuration of a variable resistance non-volatile memory device in an embodiment.

DESCRIPTION OF EMBODIMENTS (Underlying Knowledge Forming Basis of the Present Disclosure)

Generally, in an IC with enhanced security, secret information is encrypted and used by using an internally mounted encryption key (also referred to as a "private key") to prevent information leakage. In this case, it is essential that the information of the encryption key held inside is not leaked to the outside.

In recent years, a new hardware technology called physically uncle function (PUF) has been proposed. The PUF technology is a technology for generating unique individual identification information that differs for each IC by utilizing manufacturing variations. Hereinafter, in the present specification, the individual identification information generated by the PUF technology is referred to as "PUF data". PUF data is inherent data unique to each device that is associated with variations in the physical characteristics of ICs. Since slight variations in physical characteristics are used, physical analysis is difficult and artificial reproduction of the physical characteristics for each IC is difficult, so that it can be used as data that is difficult to physically duplicate.

As a specific precedent example, SRAM PUF as in NPL 1 can be exemplified. In this example, it is a PUF that uses the initial value immediately after the power is turned on, in which the threshold value variation (operating voltage variation) of the transistors in each memory cell in the SRAM determines whether the data is "0" or "1".

In addition, ReRAM (Resistive Random Access Memory: variable resistance memory) PUF such as PTL 1 to PTL 3 and NPL 2 and NPL 3 can be exemplified. In the example of PTL 3, the variation in the resistance value of the memory cell of the ReRAM is used. Then, the resistance values in the memory group are obtained, the determination value as a reference for binarization is calculated from those resistance values, and PUF data is generated. NPL 2 is a method of generating PUF data by writing two cells in the same state and comparing the magnitude relationship due to the variation in resistance value after writing. In addition, in PTL 3 and NPL 3, the randomness of ReRAM forming is used as PUF. In a ReRAM memory cell, by applying a voltage stress called forming, which is larger than the normal rewrite voltage, to cause dielectric breakdown in the initial state with a high resistance value, it is possible to transition to a rewritable variable state. Then, the voltage stress application time required in this forming process has a random characteristic for each memory cell. In this method, voltage stress for a fixed time is applied to the memory group, and the process of applying voltage stress is terminated when the forming of about half of the memory cells is completed. Then, about half of the memory cells in the initial state and about half of the memory cells in the variable state are recorded in the memory cell group after the completion as random data unique to each device. The method is a method of using the random data as PUF data.

Furthermore, as an applied function of the PUF, a reconfigurable PUF as shown in PTL 3 and NPL 4 is exemplified. In PTL 3 and NPL 4, a rewriting process is executed for a variable resistance memory cell treated as a data source of PUF. By executing the rewriting process, the structure of the device changes and the resistance value variation relationship among each of the memory cells changes, so that it is possible to generate new PUF data different from that before the rewriting process. In this way, by applying a stress such as common heat and voltage to a plurality of devices from the outside, the relationship of variation is changed, and the reconfiguration function is realized.

By recording PUF data that is a random number unique to each IC by such PUF technology, it can be treated as data that is difficult to analyze and cannot be duplicated. This PUF data is used, for example, as a device key for encrypting the above-mentioned private key. The private key encrypted by the device key (that is, PUF data) is stored in the non-volatile memory in the encrypted state. That is, since the encrypted private key recorded in the non-volatile memory can be decrypted into the original private key data only by the device key, the security strength of the private key depends on the security strength of the PUF.

On the other hand, since PUF utilizes slight variations in physical characteristics, when PUF data is reproduced for the same device, there are several issues, such as reduced reproducibility due to being susceptible to environmental changes such as temperature and power supply, and reduced uniqueness due to physical dependence in manufacturing.

In PTL 4, a technique called Fuzzy Extractor is used as a measure for improving these reproducibility and uniqueness. This is a technology equipped with post-processing for PUF data such as an algorithm and a hash function that can correct errors while maintaining the security strength of PUF.

The present disclosure provides a non-volatile memory device having higher tamper resistance and a challenge response method, which are not found in the prior art.

Hereinafter, embodiments of the invention according to the present disclosure will be described in detail with reference to the drawings. It should be noted that each of the embodiments described below shows a specific example of the present invention. Numerical values, shapes, materials, components, arrangement positions and connection forms of components, steps, order of steps, and the like shown in the following embodiments are examples, and are not intended to limit the present invention. In addition, among the components in the following embodiments, the components not described in the independent claims indicating the highest level concept of the present invention will be described as arbitrary components. In addition, each figure is not necessarily exactly illustrated. In each figure, substantially the same configuration is designated by the same reference numerals, and duplicate description may be omitted or simplified.

(Overview of the Variable Resistance Non-Volatile Memory Device Used in the Present Disclosure)

Figure 2:
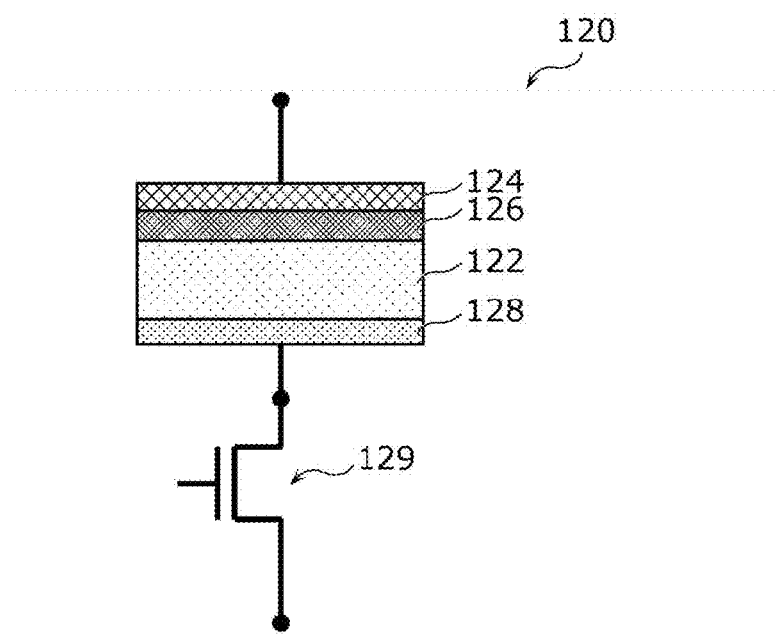
FIG. 2 is a cross-sectional view showing an example of a schematic configuration of a memory cell included in the variable resistance non-volatile memory device shown in FIG. 1.

FIG. 1 is a block diagram showing an example of a schematic configuration of variable resistance non-volatile memory device 100 in the embodiment. In addition, FIG. 2 is a cross-sectional view showing an example of a schematic configuration of memory cell 91 included in variable resistance non-volatile memory device 100 shown in FIG. 1. It should be noted that in the present specification, the variable resistance non-volatile memory device is also simply referred to as a non-volatile memory device.

In the example shown in FIG. 1, non-volatile memory device 100 in the present embodiment includes at least memory cell array 90 and control device 93. It should be noted that control device 93 does not necessarily have to be a part of non-volatile memory device 100, and may be a device provided outside non-volatile memory device 100 and connected to non-volatile memory device 100, and perform the operations described below.

Memory cell array 90 has a configuration in which a plurality of variable resistance memory cells 91 in which digital data is recorded according to the magnitude of the resistance value are arranged in an array. In the present embodiment, some memory cells 91 among the plurality of memory cells 91 configuring memory cell array 90 are assigned as memory cells for PUF data.

In the example shown in FIG. 2, resistance changing element 120 included in memory cell 91 includes base layer 122 (for example, $Ta_2O_5$), first electrode 124 (for example, Ir), resistance changing layer 126 (for example, $TaO_x$), and second electrode 128 (for example, TaN). Transistor 129 for selecting a specific memory cell is connected to each memory cell 91.

Memory cell 91 has a property of being able to take a variable state in which a resistance value reversibly transitions between a plurality of variable resistance value ranges by applying a plurality of different electric signals. The variable resistance value range includes at least a resistance value range in which a low resistance state is obtained as one state (first resistance state) of digital information and a resistance value range in which a higher resistance state than the above low resistance state is obtained as another state (second resistance state). In this way, in the variable state, the resistance value can be reversibly transitioned at least between the low resistance state and the high resistance state.

In addition, memory cell 91 has a property of being able to take an initial state. The "initial state" means a state in which the resistance value is in the initial resistance value range that does not overlap with any of the variable resistance value ranges. A memory cell in the initial state does not become a variable state unless forming is performed. "Forming" refers to applying a predetermined electrical stress to a memory cell to change the memory cell in a state that the resistance value of the memory cell reversibly transitions between a plurality of variable resistance value ranges.

The electrical stress applied for forming (forming stress) may be, for example, an electrical pulse having a predetermined voltage and time width, or may be a combination of a plurality of electrical pulses. The forming stress may be cumulative stress. In that case, when the cumulative amount of stress exceeds a predetermined amount, memory cell 91 transitions from the initial state to the variable state.

In the present embodiment, it is assumed that memory cell 91 has such a property as not to be in a state in which the resistance value reversibly transitions between a plurality of variable resistance value ranges unless forming is performed after manufacturing. That is, the resistance changing element after being manufactured by a semiconductor process or the like and before the forming stress is applied will be described as being in the initial state.

However, this property is an example and is not essential. Memory cell 91 does not have to be an element capable of taking an initial state, and may be, for example, a so-called formingless element having only a variable state.

In addition to recording an arbitrarily set data pattern with a difference in a variable state, memory cell array 90 may be used as PUF which is random individual identification information due to physical characteristics.

In one example of PUF, the resistance value variation of each memory cell in the low resistance state is used. Even in the low resistance state, there is a minute variation in the resistance value, and this characteristic is utilized in the PUF of the example. From memory cell array 90, a plurality of memory cells 91 are all set to the same resistance state as a variable state, and are treated as a memory group in which PUF data is recorded.

Figure 3:
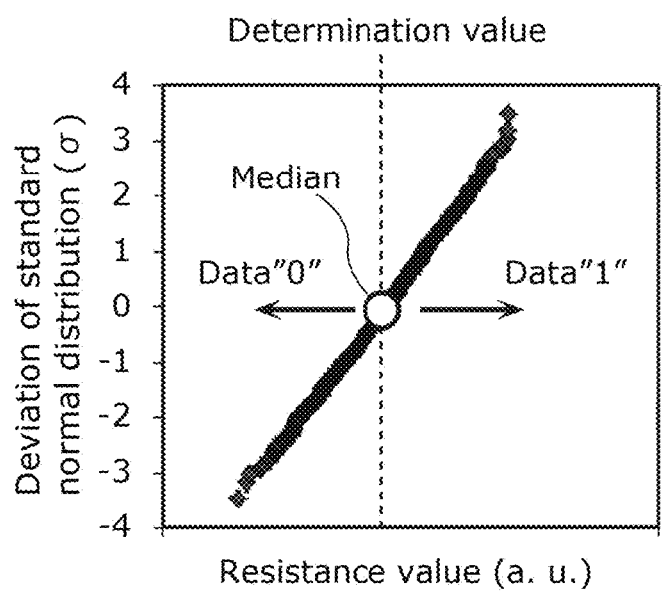
FIG. 3 is a diagram plotting the relationship between the normalized resistance value in the low resistance state obtained by actual measurement with respect to a certain memory cell array and the deviation of the standard normal distribution with respect to the variation of the value.

FIG. 3 is a diagram plotting the relationship between the normalized resistance value (horizontal axis) in the low resistance state obtained by actual measurement for a certain memory cell array and the deviation ($\sigma$) (vertical axis) of the standard normal distribution with respect to the variation of the value. As shown in FIG. 3, the distribution of the resistance value variation of the memory cells follows a normal distribution and is distributed almost linearly. From this, it can be confirmed that the resistance value variation is an extremely random phenomenon. FIG. 3 shows an example in which the median of the distribution of resistance value variation ("Median" in the figure) is set as a determination value, and, for example, digital data is output by assigning "1" data ("Data "1"" in the figure) if the resistance value is larger than the determination value, and "0" data ("Data "0"" in the figure) if it is smaller.

Figure 4:
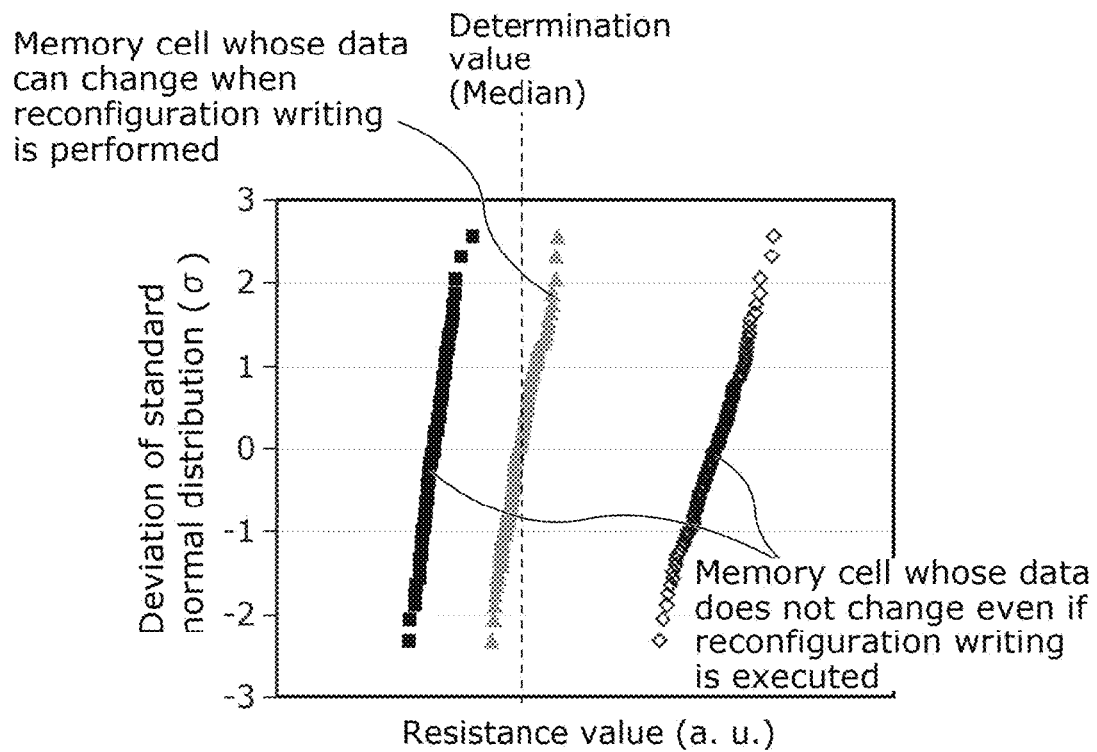
FIG. 4 is a diagram plotting the relationship between the normalized resistance value and the deviation of the standard normal distribution with respect to the variation of the value when the reconfiguration writing is executed 100 times for a certain 3-bit memory cell.
Figure 5:
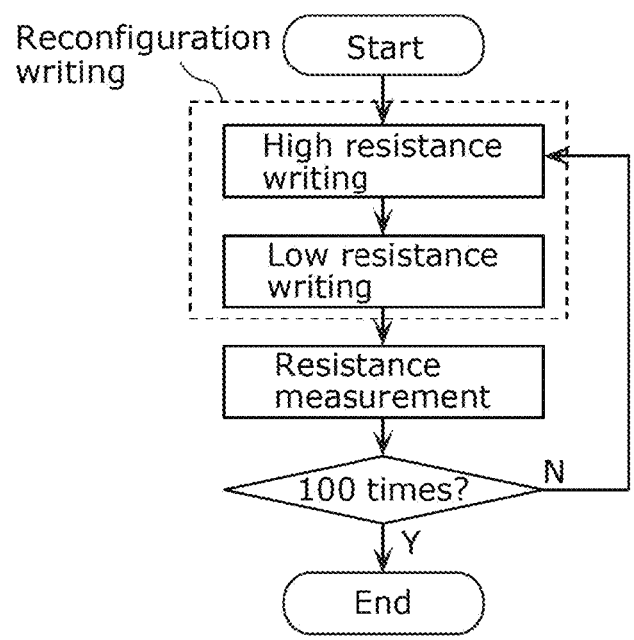
FIG. 5 is a flowchart of the reconfiguration writing by the non-volatile memory device shown in FIG. 1.

FIG. 4 is a drawing plotting the relationship between the normalized resistance value (horizontal axis) after each low resistance writing and the deviation (a) (vertical axis) of the standard normal distribution with respect to the variation of the value, when a process of writing back to the low resistance (or high resistance writing) again (hereinafter, this writing is referred to as reconfiguration writing) after the high resistance writing (or low resistance writing) as shown in the flowchart of FIG. 5 is executed 100 times for a certain 3-bit memory cell. The three distributions shown correspond to each of the 3-bit memory cells. As shown by the variation characteristics, it can be seen that the memory cells used in the present embodiment have not only the resistance value variations between the memory cells described in FIG. 3 but also the resistance value variations even after the rewriting of each memory cell. Furthermore, when the writing variation characteristics of the 3-bit memory cells are compared, it can be confirmed that the shapes and absolute values of those distributions are also significantly different, as can be seen from the fact that they are separated into three distributions. Based on this feature, for example, when a method of setting a median as shown in FIG. 3 as a determination value and outputting digital data is adopted, when reconfiguration writing is executed, it can be confirmed that memory cells that change from 0 to 1 or 1 to 0 before and after reconfiguration writing (distribution positioned at the center of FIG. 4) and memory cells that do not change from 0 or 1 before and after reconfiguration writing (distributions positioned on the left and right in FIG. 4) exist. From the above, it can be seen that, for example, by executing reconfiguration writing to the same plurality of memory cells, the data of 0 and 1 changes randomly before and after the writing of the plurality of bits, and new digital data can be constructed, while permanent data in which the data of 0 and 1 do not change can be further realized.

(Configuration and Basic Operation of Variable Resistance Non-Volatile Memory Device)

Figure 6:
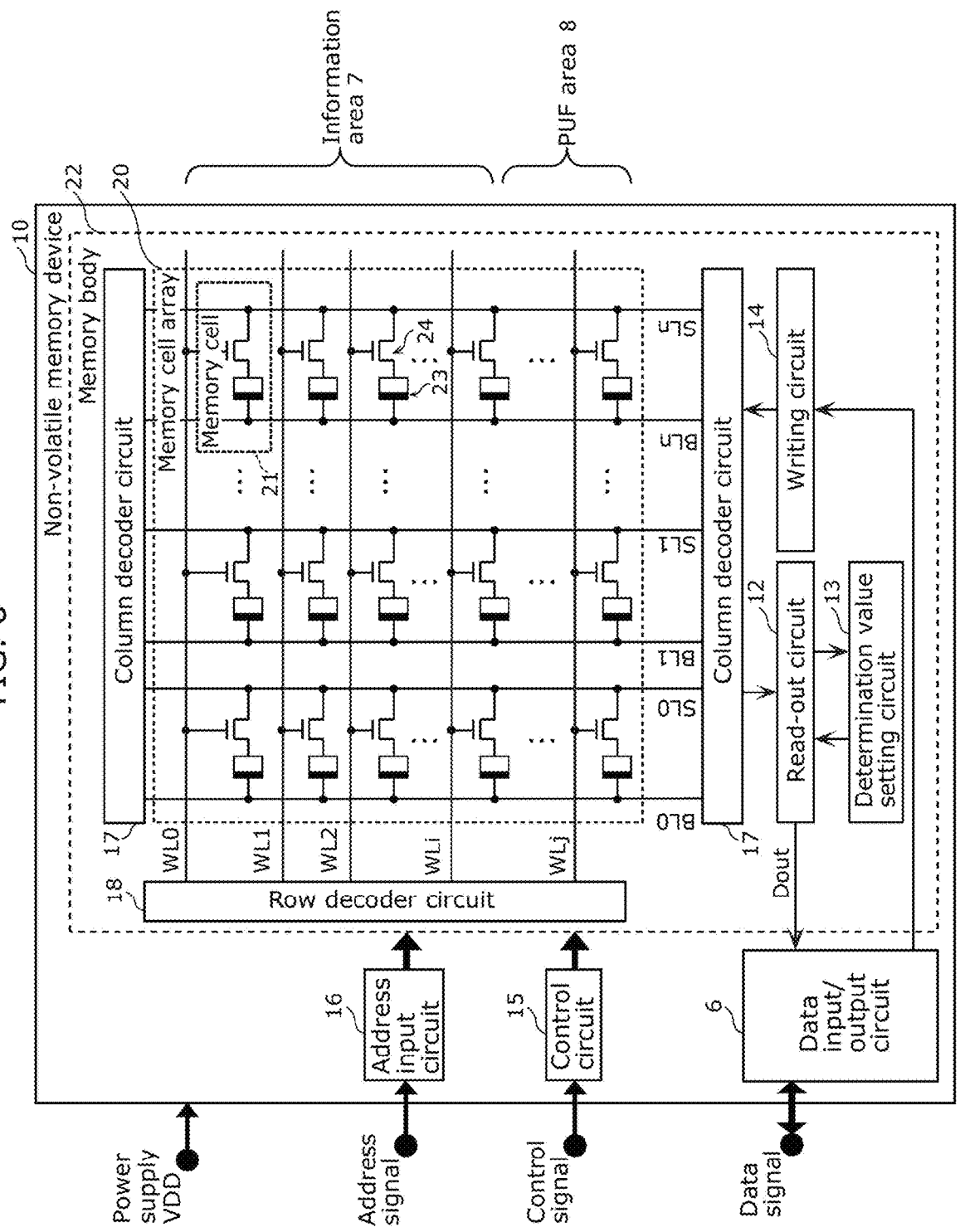
FIG. 6 is a block diagram showing a specific configuration example of the non-volatile memory device in the embodiment.

FIG. 6 is a block diagram showing a specific configuration example of non-volatile memory device 10 in the embodiment. It should be noted that non-volatile memory device 10 is a specific example of non-volatile memory device 100 described above, and executes a challenge response method for generating response data that is a private key for challenge data given from the outside. However, the specific configuration of the non-volatile memory device in the embodiment is not limited to the configuration shown in FIG. 6. In addition, the challenge data may be in any format as long as it is information that requires response data.

As shown in FIG. 6, non-volatile memory device 10 in the embodiment includes memory main body 22 on a semiconductor substrate. In addition, non-volatile memory device 10 further includes data input/output circuit 6, control circuit 15, and address input circuit 16.

Memory main body 22 includes read-out circuit 12, writing circuit 14, determination value setting circuit 13, row decoder circuit 18, column decoder circuit 17, and memory cell array 20. It should be noted that functionally, control circuit 15, read-out circuit 12, and determination value setting circuit 13 mainly configure a data generation circuit that generates response data using memory cell array 20 when challenge data is obtained from the outside. In addition, control circuit 15 and writing circuit 14 mainly configure a reconfiguration processing circuit that executes reconfiguration writing in which a voltage pulse is applied to memory cell array 20 at least once.

Writing circuit 14 applies a predetermined voltage in each operation to selected memory cell 21 to write data. For example, writing circuit 14 executes reconfiguration writing to all the memory cells in PUF area 8 in addition to executing a writing operation for setting information area 7 described later in an arbitrary resistance state.

Read-out circuit 12 executes a read-out operation in parallel for each of the plurality of memory cells 21, and outputs digital data Dout based on a comparison between the obtained resistance value and the determination value output from determination value setting circuit 13 described later. It should be noted that read-out circuit 12 includes an error correction circuit.

Determination value setting circuit 13 calculates the median of the resistance value variation distribution from the resistance values of the memory cells in the PUF area described later, and outputs (that is, sets) it to read-out circuit 12 as a determination value which is an example of the first determination value. In addition, determination value setting circuit 13 outputs (that is, sets) the first permanent determination value and the second permanent determination value as determination values to read-out circuit 12 in order to extract the permanent data whose data does not change even if the reconfiguration writing is performed. It should be noted that the first permanent determination value is an example of a third determination value larger than the first determination value, and the second permanent determination value is an example of a second determination value smaller than the first determination value. For example, when the digital data generated with the median as the determination value (hereinafter, the digital data generated by using the determination value is referred to as PUF data) is reproduced in read-out circuit 12, determination value setting circuit 13 sets the median based on the resistance values obtained from read-out circuit 12. On the other hand, when permanent data is extracted in read-out circuit 12, determination value setting circuit 13 sets the first permanent determination value or the second permanent determination value in order to extract position information data of the bit whose data does not change even if reconfiguration writing is performed (hereinafter, such position information data is referred to as permanent PUF information data).

It should be noted that calculating the median of the obtained resistance values as the determination value, determining whether the obtained resistance values are larger than the determination value, determining the first permanent determination value and second permanent determination value in order to extract the permanent data, and generating the PUF data and extracting the permanent data may not be performed in memory main body 22 including determination value setting circuit 13 and read-out circuit 12, and may be performed outside memory main body 22.

Row decoder circuit 18 selects one word line WL from a plurality of j word lines WL0 to WLj connected to memory cell array 20.

Column decoder circuit 17 selects k bit lines BL, which is the number of parallel read-outs (the number of memory cells configuring the memory group) from a plurality of n bit lines BL0 to BLn and a plurality of n source lines SL0 to SLn, and the corresponding k source lines SL, and connects the selected lines to writing circuit 14 and read-out circuit 12.

These (writing circuit 14, read-out circuit 12, row decoder circuit 18, and column decoder circuit 17) operate according to the number of rows and/or columns in which read-out and/or writing is performed in parallel.

Read-out circuit 12 outputs digital data Dout. Read-out circuit 12 is connected to k memory cells selected by column decoder circuit 17 and row decoder circuit 18 via k bit lines, and compares the resistance values of k memory cells with the determination value set by determination value setting circuit 13 to output generated digital data Dout to data input/output circuit 6.

Memory main body 22 includes information area 7 and PUF area 8 as storage areas. Information area 7 is an area to which the word lines WL0 to WLi are connected, while PUF area 8 is an area to which WLi+1 to WLj are connected. Information area 7 is an example of a first area configured by the memory cells that hold the resistance values necessary for generating response data, while PUF area 8 is an example of a second area configured by the memory cells that hold information other than the resistance values. Specifically, information area 7 includes a data cell and arbitrary data (user data) is recorded, while PUF data in which the same resistance state is set is recorded in PUF area 8.

It should be noted that information area 7 and PUF area 8 do not need to be separated by a word line as shown in FIG. 6, and may be separated by an arbitrary area on memory cell array 20. At this time, the resistance to attacks such as hacking can increase with the regularity of the physical area division more complicated. In addition, information area 7 and PUF area 8 may be further subdivided so that access can be restricted according to the importance of security. For example, it is included that the security data in PUF area 8 in which the PUF data is stored may be restricted so that it cannot be accessed from the user side, and so on.

Memory cell array 20 includes the plurality of word lines WL0 to WLj, the plurality of bit lines BL0 to BLn formed so as to intersect word lines WL0 to WLj and extend parallel to each other, and the source lines SL0 to SLn formed so as to intersect word lines WL0 to WLj and extend parallel to each other and parallel to bit lines. Then, memory cells 21 are arranged at the three-dimensional intersections of word lines WL0 to WLj and bit lines BL0 to BLn, respectively.

Each memory cell 21 includes resistance changing element 23 and transistor 24. Word lines WL0 to WLj are connected to the gate terminals of respective transistors 24, bit lines BL0 to BLn are connected to the second electrodes of resistance changing elements 23 included in respective memory cell 21, the first electrodes of resistance changing elements 23 are connected to the second main terminals of transistors 24, respectively, and source lines SL0 to SLn are connected to the first main terminals of transistors 24, respectively.

Resistance changing element 23 operates as a non-volatile memory element in memory cell 21. Non-volatile memory device is a so-called 1T1R-type variable resistance non-volatile memory device in which each memory cell 21 is configured by one transistor 24 and one resistance change element 23. The selection element of the memory cell is not limited to the above-mentioned transistor. For example, a two-terminal element such as a diode may be used.

Control circuit 15 causes column decoder circuit 17 to select either a bit line or a source line based on a control signal given from the outside, to connect the selected bit line or source line to writing circuit 14 at the time of writing, and to connect the selected bit line or source line to read-out circuit 12 at the time of the read-out. Then, writing circuit 14 or read-out circuit 12 is operated. Control circuit 15 may be configured by a memory in which the program is stored, a processor that executes the program, an input/output circuit, and the like, or may be configured by a dedicated logic circuit.

Since resistance changing element 23 can have the same configuration as resistance changing element 120 described above using FIG. 2 in the embodiment, detailed description thereof will be omitted.

It should be noted that in the example shown in FIG. 6, an NMOS transistor is used as the selection transistor of memory cell array 20, but it is not limited thereto, and a PMOS transistor may be used.

Figure 7:
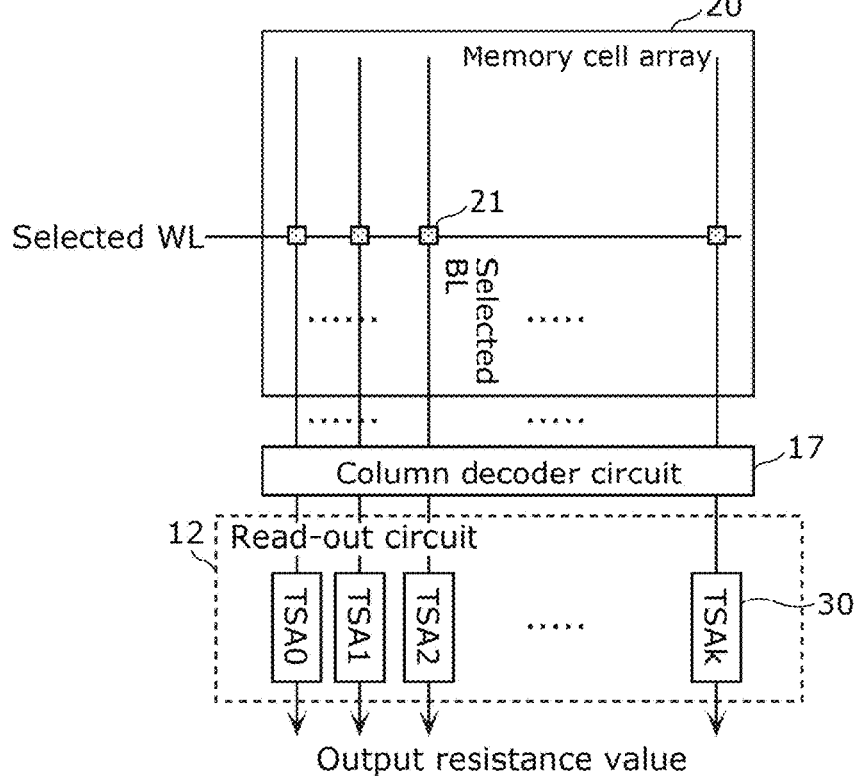
FIG. 7 is a diagram showing a configuration example of a read-out circuit included in the non-volatile memory device shown in FIG. 6.

FIG. 7 is a diagram showing a configuration example of read-out circuit 12 included in non-volatile memory device 10 shown in FIG. 6. It should be noted that memory cell array 20 and column decoder circuit 17 are also shown in this figure. Read-out circuit 12 includes k (k is an integer satisfying 1≤k≤n) sense amplifier circuits 30 (TSA0, TSA1, TSA2, . . . TSAk) in order to perform a read-out operation in parallel in units of a memory group consisting of k memory cells 21. Therefore, read-out circuit 12 has k sense amplifier circuits 30. The k bit lines selected by column decoder circuit 17 are connected to k sense amplifier circuits 30, respectively. Each sense amplifier circuit 30 outputs the resistance value of connected memory cell 21.

Figure 8:
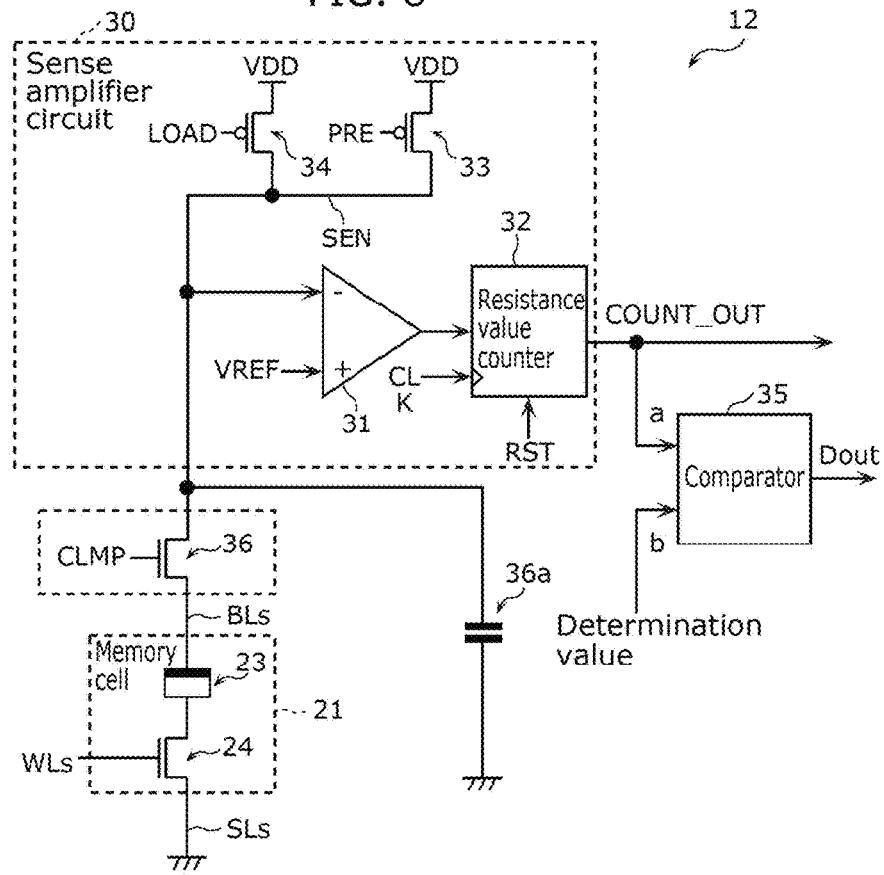
FIG. 8 is a circuit diagram showing a more detailed configuration example for one bit of the read-out circuit shown in FIG. 7.

FIG. 8 is a circuit diagram showing a more detailed configuration example for one bit (that is, corresponding to the read-out from one memory cell 21) of read-out circuit 12 shown in FIG. 7.

Read-out circuit 12 includes sense amplifier circuit 30. Sense amplifier circuit 30 includes comparator 31, resistance value counter 32, precharge MOSFET transistor 33, load MOSFET transistor 34, and a clamp circuit configured by clamp NMOS transistor 36.

Resistance value counter 32 is connected to the output destination of comparator 31. Resistance value counter 32 starts counting with a CLK signal after the count value in resistance value counter 32 is initialized by setting reset control signal RST to a low level. The CLK signal is a signal output from control circuit 15 and is a reference signal for converting the discharge time or charge time that changes depending on the resistance value of resistance changing element 23 into a count value. The CLK signal is, for example, a square wave that maintains a constant frequency. Every time this CLK signal rises, one count value of resistance value counter 32 is added, and when node SEN falls below reference voltage VREF, the output signal from comparator 31 is inverted, and the count value at that time is held as COUNT_OUT. Count value COUNT_OUT is input to input terminal a of comparator 35, while the determination value received from determination value setting circuit 13 is input to input terminal b of comparator 35. In comparator 35, the value of input terminal a is compared with the value of input terminal b, and the comparison result is transmitted to data input/output circuit 6 as digital data Dout.

In precharge MOSFET transistor 33, precharge control signal PRE is input to the gate terminal, power supply voltage VDD is input to the source terminal, and node SEN is connected to the drain terminal.

Capacitor 36a is installed to adjust the discharge or charge time, and one end is connected to node SEN and the other end is connected to the GND.

In load MOSFET transistor 34, load control signal LOAD is input to the gate terminal, power supply voltage VDD is input to the source terminal, and node SEN is connected to the drain terminal.

In clamp NMOS transistor 36, clamp control signal CLMP is input to the gate terminal, node SEN is connected to either the source terminal or the drain terminal, and a memory cell is connected to the other end.

Figure 9:
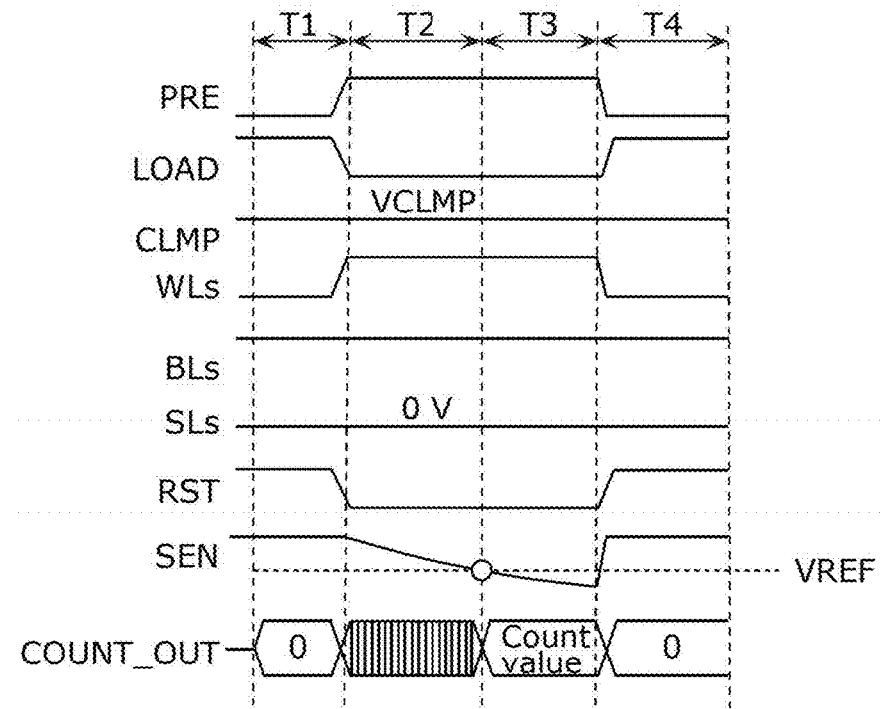
FIG. 9 is a timing chart when reading out a memory cell selected in the non-volatile memory device shown in FIG. 6.

FIG. 9 is a timing chart when reading out the selected memory cell in non-volatile memory device 10 shown in FIG. 6.

During the precharge period of T1, precharge control signal PRE is at a low level and precharge PMOS transistor 33 is in an on state, while load control signal LOAD is at a high level and load PMOS transistor 34 is in an off state. The potential of selected word line WLs is at a low level and transistor 24 is in an off state.

By applying the voltage of VCLMP to the gate terminal of clamp NMOS transistor 36 of the clamp circuit, the potential of selected bit line BLs is precharged to the potential obtained by subtracting VT (threshold value of clamp NMOS transistor 36) from VCLMP. Selected source line SLs is fixed to GND. Node SEN is precharged to power supply voltage VDD. In addition, since reset control signal RST of resistance value counter 32 connected to the output of comparator 31 is at a high level, a fixed value of 0 is output as count value COUNT_OUT from the output terminal of resistance value counter 32.

In the sense period of T2, precharge MOSFET transistor 33 is turned off by setting precharge control signal PRE to a high level, and load MOSFET transistor 34 is turned on by setting load control signal LOAD to a low level. In addition, NMOS transistor 24 is turned on by setting the potential of selected word line WLs to a high level.

Then, a voltage is applied to selected source line SLs via memory cell 21 selected from selected bit line BLs, and discharge is started. At the same time as the discharge starts, reset control signal RST of resistance value counter 32 becomes a low level, and counting at resistance value counter 32 starts. Then, for each count, comparator 31 compares the potential of node SEN with the voltage of reference voltage VREF, and the count value continues to be added until node SEN falls below reference voltage VREF. The higher the resistance value of resistance changing element 23 at the time of the read-out, the longer the discharge time and the larger the count value.

It is also possible to adjust the discharge time by adjusting the capacity of capacitor 36*a*. If the capacitance of capacitor 36*a* is large, the discharge time of node SEN is long, so that the count value is large. If the capacitance is small, the discharge time of node SEN is short, and the count value is small. Adjusting the capacitance of capacitor 36*a* is effective, for example, when it is desired to improve the detection accuracy of a low resistance level having a short discharge time. Since the count interval is determined by the CLK signal, its operating frequency is the resolution of the count value. However, when reading out a low resistance value, the discharge time may be close to the resolution of the count value, so that it may not be possible to distinguish between the magnitude of the resistance value. Therefore, by adding a capacitive load to node SEN and lengthening the discharge time, it is possible to intentionally secure a level of discharge characteristics that can be detected with the resolution.

In the latch period of T3, the count value of resistance value counter 32 when node SEN falls below reference voltage VREF after the discharge is started is latched. The latched count value is output as COUNT_OUT and is treated as the count value of resistance changing element 23.

In the reset period of T4, when the data output of resistance value counter 32 is completed, the potential of selected word line WLs is set to the low level, transistor 24 of selected memory cell 21 is turned off, and the read-out operation is completed.

Count value COUNT_OUT stored in resistance value counter 32 is input to determination value setting circuit 13, and the determination value (median) is calculated in determination value setting circuit 13 based on input count value COUNT_OUT.

It should be noted that since read-out circuit 12 shown in FIG. 7 is includes 16 sense amplifier circuits 30 in non-volatile memory device 10 in the present embodiment, a maximum of 16 sense amplifier circuits 30 can be operated in parallel.

Next, an example of the operation of non-volatile memory device 10 in the present embodiment will be described. Non-volatile memory device 10 in the present embodiment has five modes: PUF registration mode, PUF reproduction mode, PUF reconfiguration mode, permanent PUF registration mode, and permanent PUF data reproduction mode. These operations are selected by a control signal input from the outside, and the operation of each mode is executed by control circuit 15. In addition, the challenge data can be input to control circuit 15 from the outside as a control signal, and the response data can be output to the outside from data input/output circuit 6 as a data signal. The operation when each mode is executed will be described in detail below.

(PUF Registration Mode)

In the PUF registration mode, when the first type of challenge data is obtained, the data generation circuit included in non-volatile memory device 10 generates the first response data, which is PUF data, by the comparison of the first determination value set by determination value setting circuit 13 with the resistance value read out from memory cell 21, and stores it in PUF area 8. Then, the data generation circuit generates a third response data that is different from the first response data and stores it in PUF area 8, when the reconfiguration writing is executed by the reconfiguration processing circuit after the first response data is generated, and the first type of challenge data is obtained again after the reconfiguration writing is executed. That is, in this PUF registration mode, non-volatile memory device 10 generates new PUF data that is updated by the reconfiguration writing each time the first type of challenge data is obtained.

Hereinafter, the PUF registration mode will be described in detail with reference to FIG. 10 and FIG. 11.

Figure 10:
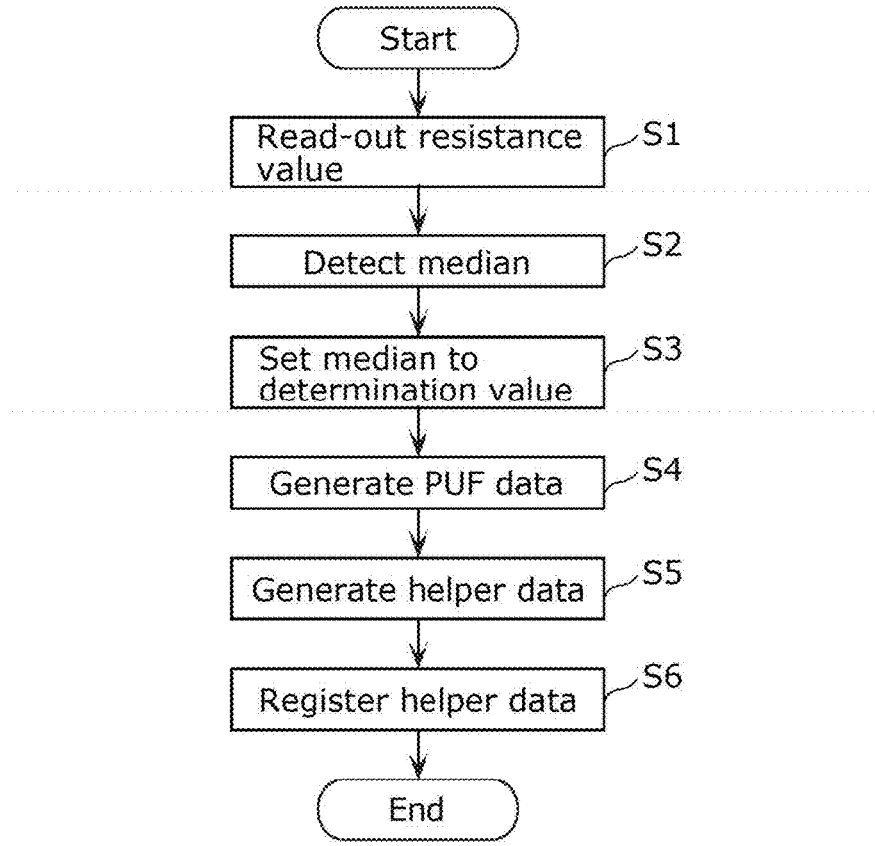
FIG. 10 is a flowchart showing an operation example at the time of PUF data registration by the non-volatile memory device in the embodiment.
Figure 11:
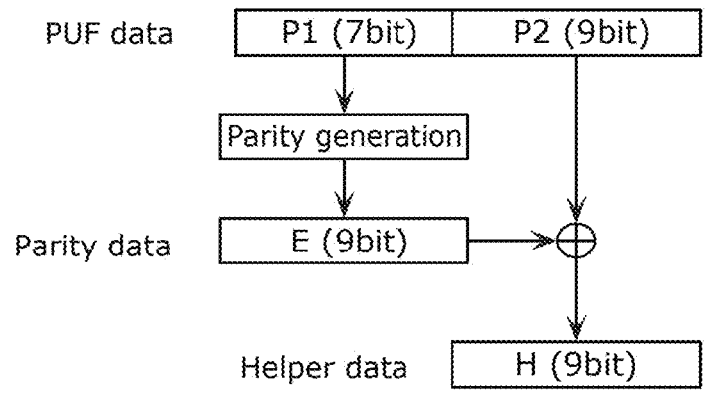
FIG. 11 is a data flow diagram showing a method of generating helper data generated at the time of PUF data registration by the non-volatile memory device in the embodiment.

FIG. 10 is a flowchart showing an operation example at the time of PUF data registration by non-volatile memory device 10 in the present embodiment. FIG. 11 is a data flow diagram showing a method of generating helper data generated when PUF data is registered by non-volatile memory device 10 in the present embodiment.

In FIG. 10, when the first type of challenge data is input to non-volatile memory device 10, in step S1, the resistance value of each memory cell 21 in PUF area 8 set in the low resistance state is read out by sense amplifier circuit 30, and in step S2, the median of the variation distribution is calculated in determination value setting circuit 13 based on the read-out resistance values. In step S3, the median calculated in step S2 is output to read-out circuit 12 as a determination value, and in step S4, PUF data is generated as the first response data or the third response data by comparing the magnitude of the determination value and the resistance value in read-out circuit 12. In step S5, helper data which is error correction information of the generated PUF data is generated in read-out circuit 12. In step S6, the generated helper data passes through data input/output circuit 6 and writing circuit 14 and is written to any specified address in information area 7, and the registration is completed.

Next, a method of generating helper data by read-out circuit 12 will be described with reference to FIG. 11. In the present embodiment, a BCH (15+1, 7) code is used as a correction code used when generating helper data. The BCH (15+1, 7) uses a total of 16 bits of 7-bit information bits and 9-bit parity bits as code data, and can perform 2-bit error correction and 3-bit error detection among the 16 bits. In the generation of helper data, the 16-bit PUF data generated in step S4 of FIG. 10 is divided into two of upper 7 bits (P1) and lower 9 bits (P2). Next, 7-bit P1 is set as information bits of BCH code, and 9-bit parity data (E) corresponding to P1 is generated. The 9-bit helper data (H) is obtained by XORing the generated 9-bit parity bit (E) and the generated PUF data P2. The generated helper data (H) is written and held at an arbitrary designated address in information area 7 in the same manner as normal memory data.

(PUF Reproduction Mode)

Next, the flow of PUF data reproduction will be described with reference to FIG. 12 and FIG. 13.

Figure 12:
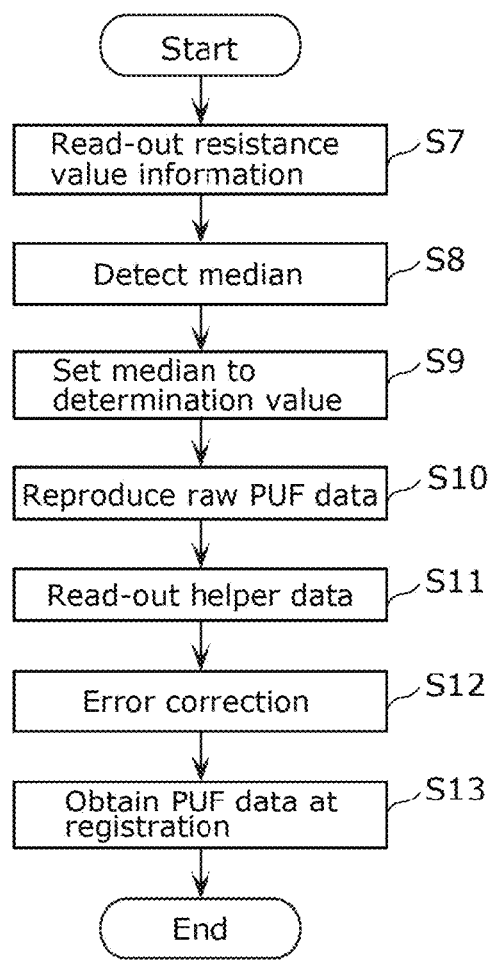
FIG. 12 is a flowchart showing an operation at the time of PUF data reproduction by the non-volatile memory device in the embodiment.

FIG. 12 is a flowchart showing an operation during PUF data reproduction by non-volatile memory device 10 in the present embodiment. FIG. 13 is a data flow showing processing from helper data used at the time of PUF data reproduction and raw PUF data including errors to the reproduction of correct PUF data at the time of registration, by non-volatile memory device 10 in the present embodiment.

In FIG. 12, in step S7, the resistance value of each memory cell in PUF area 8 is read out by sense amplifier circuit 30. In step S8, the median is detected by determination value setting circuit 13 using the read-out resistance value, and in step S9, the detected median is output to read-out circuit 12 as the determination value. In step S10, in read-out circuit 12, the magnitude of the resistance value read out in step S7 and the determination value set in step S9 are compared, and raw PUF data is generated. Subsequently, in read-out circuit 12, the helper data stored at the time of registering the PUF data is read out in step S11. In step 12, error correction is executed by the error correction circuit included in read-out circuit 12 using the raw PUF data obtained in step S9 and the helper data read out in step S10, and as a result, the correct PUF data at the time of registration is obtained in step S13.

Next, an error correction method using helper data by the error correction circuit of read-out circuit 12 in step S12 will be described with reference to FIG. 13. The raw PUF data reproduced in step S10 may cause an error due to the aged deterioration of the device and the influence of environmental changes during operation. In the following description, it is assumed that errors of e1 and e2 occur in P1 and P2, respectively, with respect to the 16-bit raw PUF data obtained during reproduction (where, e1+e2 is 2 bits or less). By XORing helper data (H) read out in step S11 and the lower 9 bits (P2+e2) of the raw PUF data, the parity bits for the upper 7 bits generated at the time of PUF data registration are reproduced. However, since raw PUF data P2 includes the error of e2, it is actually reproduced as the parity bit (E+e2) including the error of e2. Next, error correction is executed using raw PUF data (P1+e1) of the upper 7 bits and parity data (E+e2) after reproduction. If e1+e2 is an error of 2 bits or less, it is the number of error bits which can be corrected, so that it is corrected into the original PUF data (P1) and parity data (E), and the correct P1 and E are reproduced. Finally, by XORing the correctly reproduced parity data (E) and helper data (H), the original correct P2 data can be obtained, and the correct 16-bit PUF data at the time of PUF data registration can be obtained.

Figure 13:
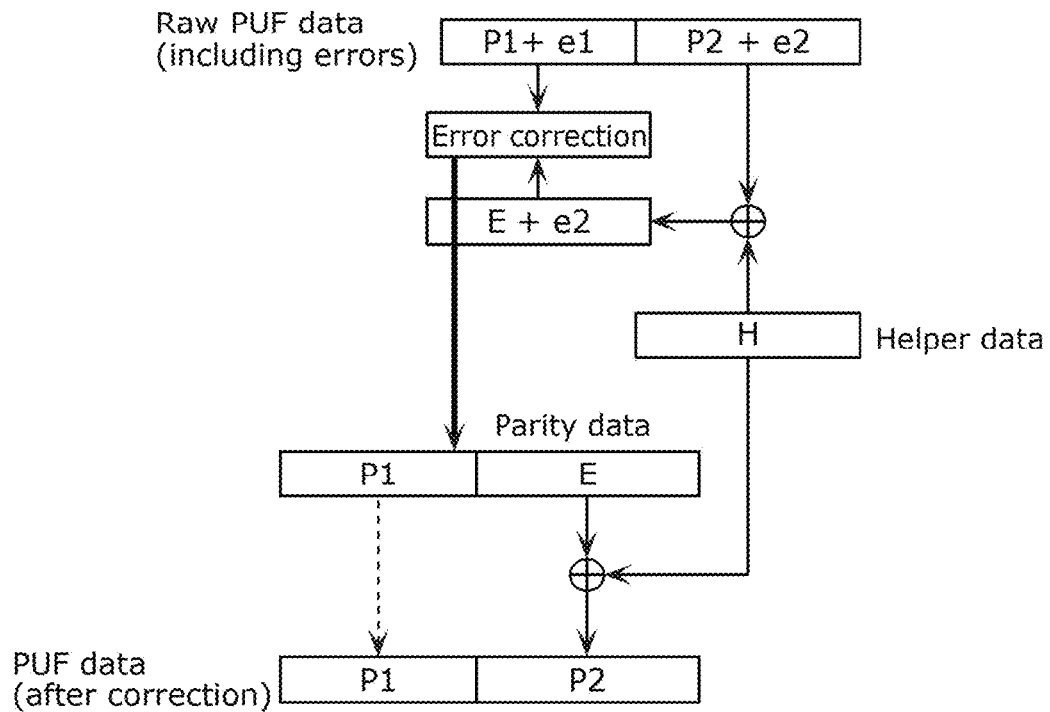
FIG. 13 is a data flow diagram showing a process of reproducing correct PUF data at the time of registration by the non-volatile memory device in the embodiment.

It should be noted that the processing described with reference to FIG. 12 and FIG. 13 is performed by read-out circuit 12 and the like as described above, but it is not limited thereto, and may be performed by other components included in non-volatile memory device 10, or may be performed by an external component of non-volatile memory device 10.

It should be noted that in general error correction, parity data (error correction data) corresponding to information data is added in order to perform error correction, and both the data and the parity data are stored in the non-volatile memory. For example, when parity data is added to PUF data and stored in a non-volatile memory, since this parity data is associated with PUF data on a one-to-one basis, there is a risk that PUF data will be inferred from the information of the parity data. However, in the PUF data error correction method described in the present embodiment, the PUF data is divided into two, parity data corresponding to one PUF data is generated, and then the data generated by XOR encryption with the other PUF data is stored as helper data, it becomes difficult to predict the original PUF data from the helper data. That is, the above-mentioned error correction method is more secure than the conventional error correction method.

(PUF Reconfiguration Mode)

Figure 14:
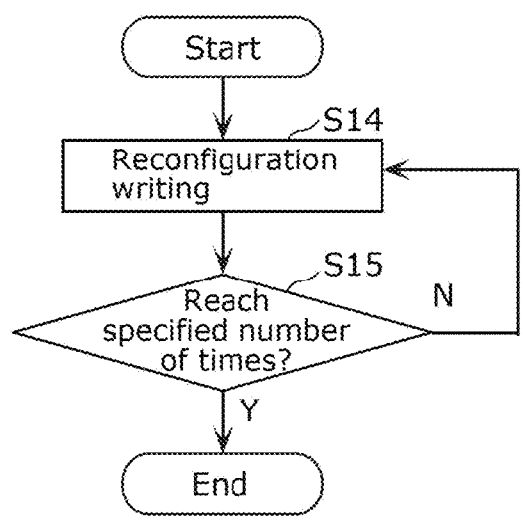
FIG. 14 is a flowchart showing an operation example of the PUF reconfiguration mode by the non-volatile memory device in the embodiment.
Figure 15:
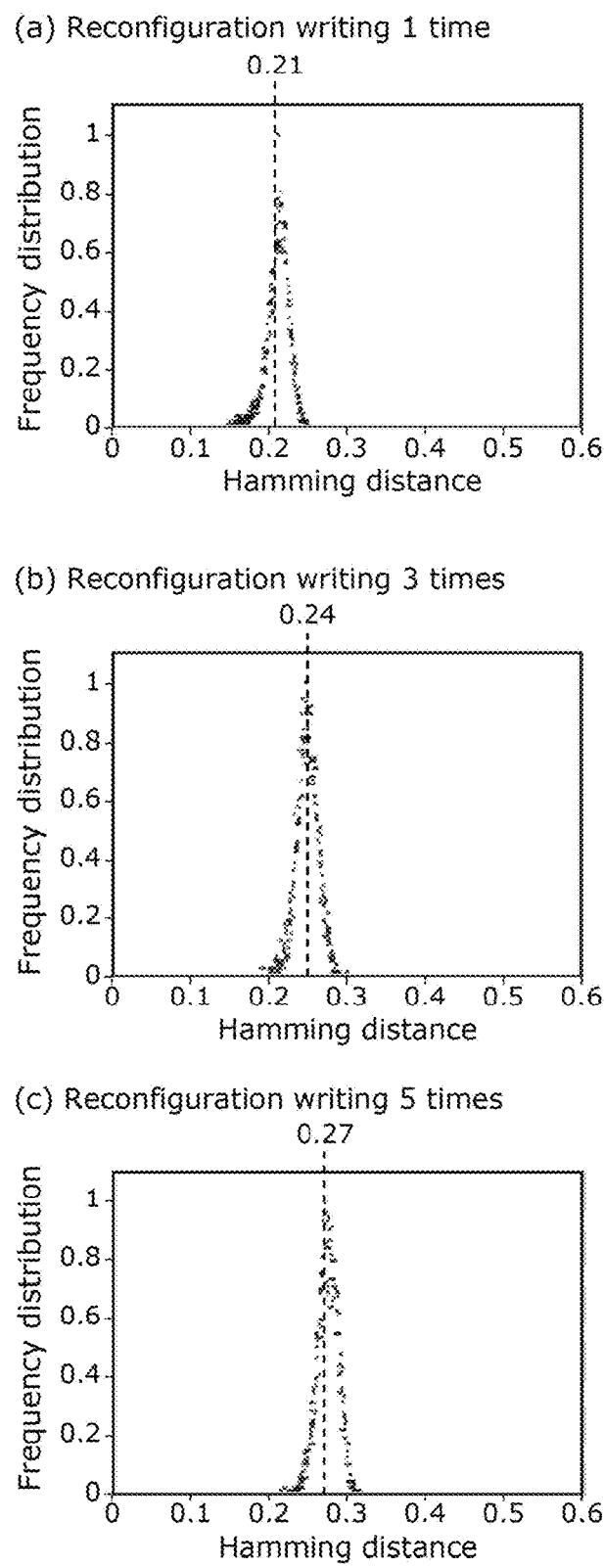
FIG. 15 is a graph showing the Hamming distance and the normalization frequency between PUF data at each number of times generated when the reconfiguration writing of FIG. 14 is executed 100 times.

FIG. 14 is a flowchart showing an operation example of the PUF reconfiguration mode by non-volatile memory device 10 in the present embodiment. In step S14, control circuit 15 (that is, the reconfiguration processing circuit included in non-volatile memory device 10) executes the reconfiguration writing that continuously processes the high resistance writing and the low resistance writing described in FIG. 5. Then, based on the determination in step S15, the reconfiguration writing is executed until the specified number of times is reached. The specified number of times used in the determination in step S15 (that is, the number of reconfiguration writings) is an effective parameter for improving the uniqueness of the PUF before and after the reconfiguration writing. FIG. 15 is a graph showing the Hamming distance between PUF data at each number of times generated when the reconstruction writing of FIG. 14 is executed 100 times, with the horizontal axis as the Hamming distance and the vertical axis as the normalization frequency. (a) to (c) in FIG. 15 are graphs in the case where the number of reconfiguration writings is changed to 1, 3, and 5, respectively. This graph based on the Hamming distance is used as an evaluation index of the uniqueness of PUF data, and the ideal value is that the width of the distribution is narrow and the center is 0.5 (that is, the values of half of the bits are different). As shown in (a) to (c) in FIG. 15, comparing the distributions when the number of reconfiguration writings is changed to 1, 3, and 5, by increasing the number of reconstruction writings, the center of the distribution approaches 0.5 such as 0.21, 0.24, and 0.27, and it can be confirmed that the uniqueness is improved. That is, in the PUF reconfiguration mode, the number of reconfiguration writings is an important parameter for improving the uniqueness. However, on the other hand, although increasing the number of reconfigurations improves the uniqueness, a large amount of voltage stress is applied to the memory cell, and there is a possibility that the reliability may decrease. Regarding the selection of the number of reconfigurations, it is necessary to select the optimum number of times according to the specifications of uniqueness and reliability required for the intended use.

(Permanent PUF Registration Mode)

In the permanent PUF registration mode, the data generation circuit included in non-volatile memory device 10 generates the second response data, which is PUF data, by comparing the first determination value set by determination value setting circuit 13 with the resistance value read out from memory cell 21, and stores it in PUF area 8, when the second type of challenge data is obtained. Then, the data generation circuit generates a fourth response data that is identical to the second response data and stores it in PUF area 8, when the reconfiguration writing is executed by the reconfiguration processing circuit after the second response data is generated, and the second type of challenge data is obtained again after the reconfiguration writing is executed. That is, in this permanent PUF registration mode, non-volatile memory device 10 generates new PUF data that is not updated by the reconfiguration writing each time the second type of challenge data is obtained.

Figure 16:
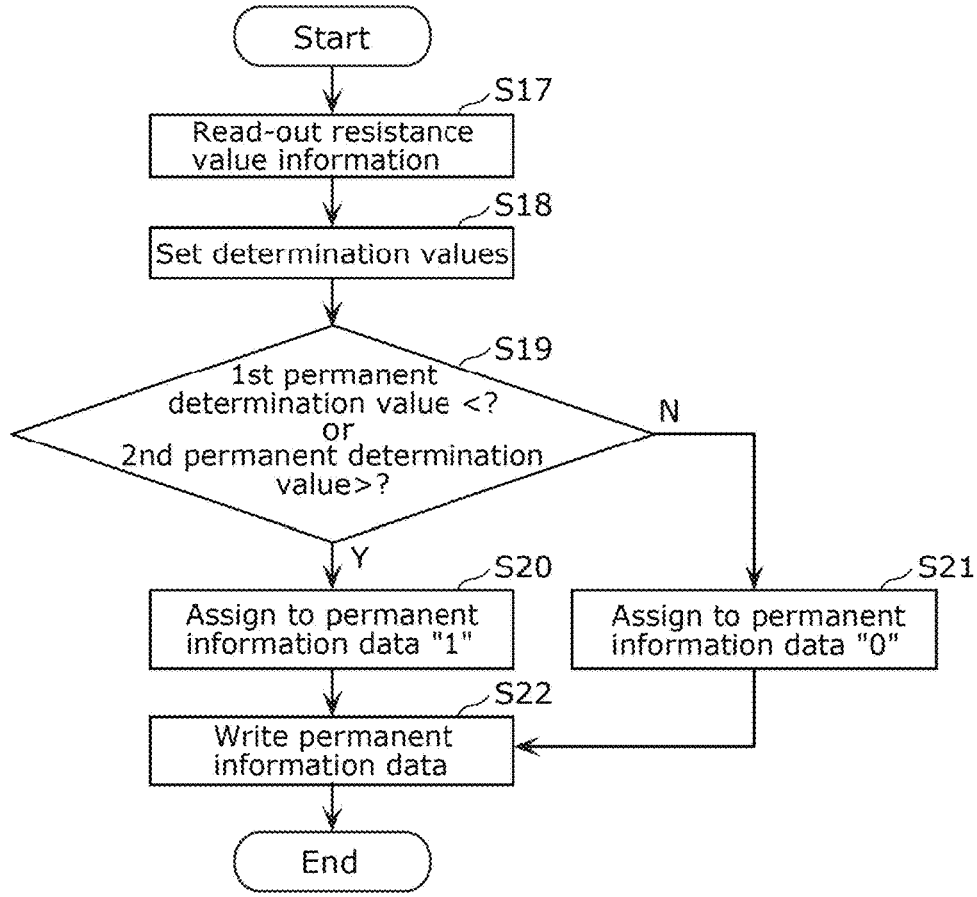
FIG. 16 is a flowchart showing an operation example of the permanent PUF data registration mode by the non-volatile memory device in the embodiment.
Figure 17:
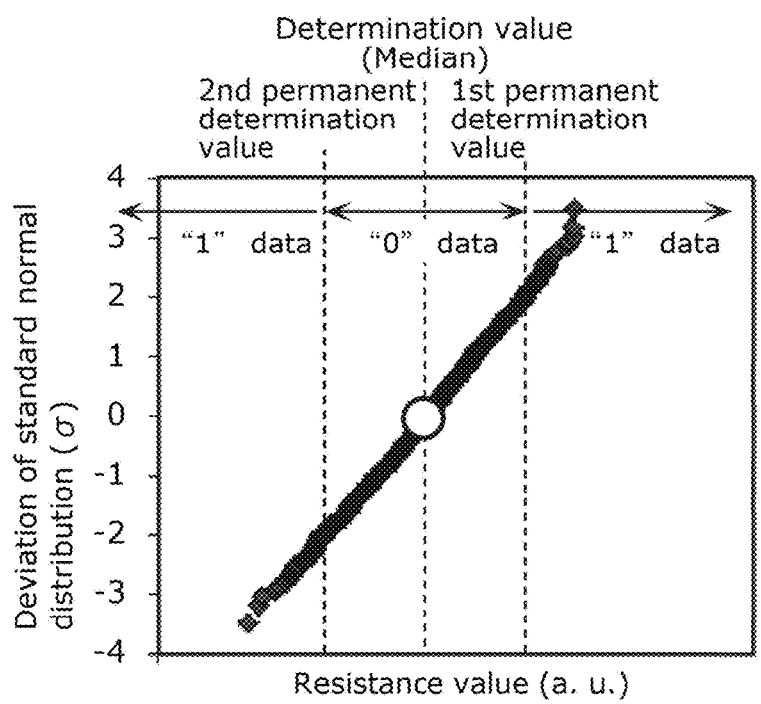
FIG. 17 is a diagram in which a description regarding the permanent PUF data registration mode is added to FIG. 3.

Hereinafter, the operation of the permanent PUF data registration mode will be described with reference to FIG. 16, FIG. 17, and FIG. 18. FIG. 16 is a flowchart showing an operation example of the permanent PUF data registration mode by non-volatile memory device 10 in the present embodiment. FIG. 17 is a diagram in which a description regarding the permanent PUF data registration mode is added to FIG. 3. FIG. 18 is a diagram showing a specific example of data used for generating permanent PUF data by non-volatile memory device 10 in the present embodiment. More specifically, (a) in FIG. 18 shows an example of the median, the first permanent determination value and the second permanent determination value, (b) in FIG. 18 shows an example of the value of the resistance value register, and (c) of FIG. 18 shows an example of PUF data and permanent information data.

In FIG. 16, in step S17, the resistance value of each memory cell in PUF area 8 is read out by sense amplifier circuit 30. In step S18, determination value setting circuit 13 outputs (that is, sets) the first permanent determination value set with a resistance value higher than the determination value used for generating the PUF data (hereinafter, also referred to as the PUF determination value) and the second permanent determination value set with a resistance value lower than the PUF determination value to read-out circuit 12. Subsequently, in step S19, read-out circuit 12 compares the resistance value of each memory cell with the set first permanent determination value and second permanent determination value. In steps S20 and S21, as shown in FIG. 17, a memory cell with a resistance value larger than the first permanent determination value and smaller than the second permanent determination value is assigned as "1" data, a memory cell with a resistance value smaller than the first permanent determination value and larger than the second permanent determination value is assigned as "0" data, and the data assigned in this way is obtained as permanent information data (that is, mask data). Finally, in step S22, read-out circuit 12 stores the obtained permanent information data in the designated information area 7 in the same manner as in the normal memory, and the operation ends. This permanent information data does not indicate the permanent PUF data, but is the data indicating the position (address) information of the target bit of the permanent PUF data, so that it can be said that even if this data is stolen, there is no risk of leaking the permanent PUF data.

In the following, an example of processing with specific values will be described with reference to FIG. 18. In FIG. 18, for the sake of simplification of the description, the obtained bit is 16 bits. For example, as shown in (a) in FIG. 18, the median (that is, PUF determination value) detected in advance by determination value setting circuit 13 is 124, the set first permanent determination value is 210, and the set second permanent determination value is 40. When the resistance value of each memory cell measured by the sense amplifier circuit is read out, as shown in (b) in FIG. 18, the resistance value of each memory cell is stored in the resistance value register mounted in read-out circuit 12. Next, as shown in (c) in FIG. 18, the PUF data (1000111000010110 in the table) is generated by comparing the obtained resistance value with the median in readout circuit 12, and furthermore, the permanent information data (1110001000010011 in the table) is generated by comparing this obtained resistance value with the first permanent determination value and the second permanent determination value. Permanent information data is stored and managed at a designated address in information area 7.

(Permanent PUF Reproduction Mode)

Figure 19:
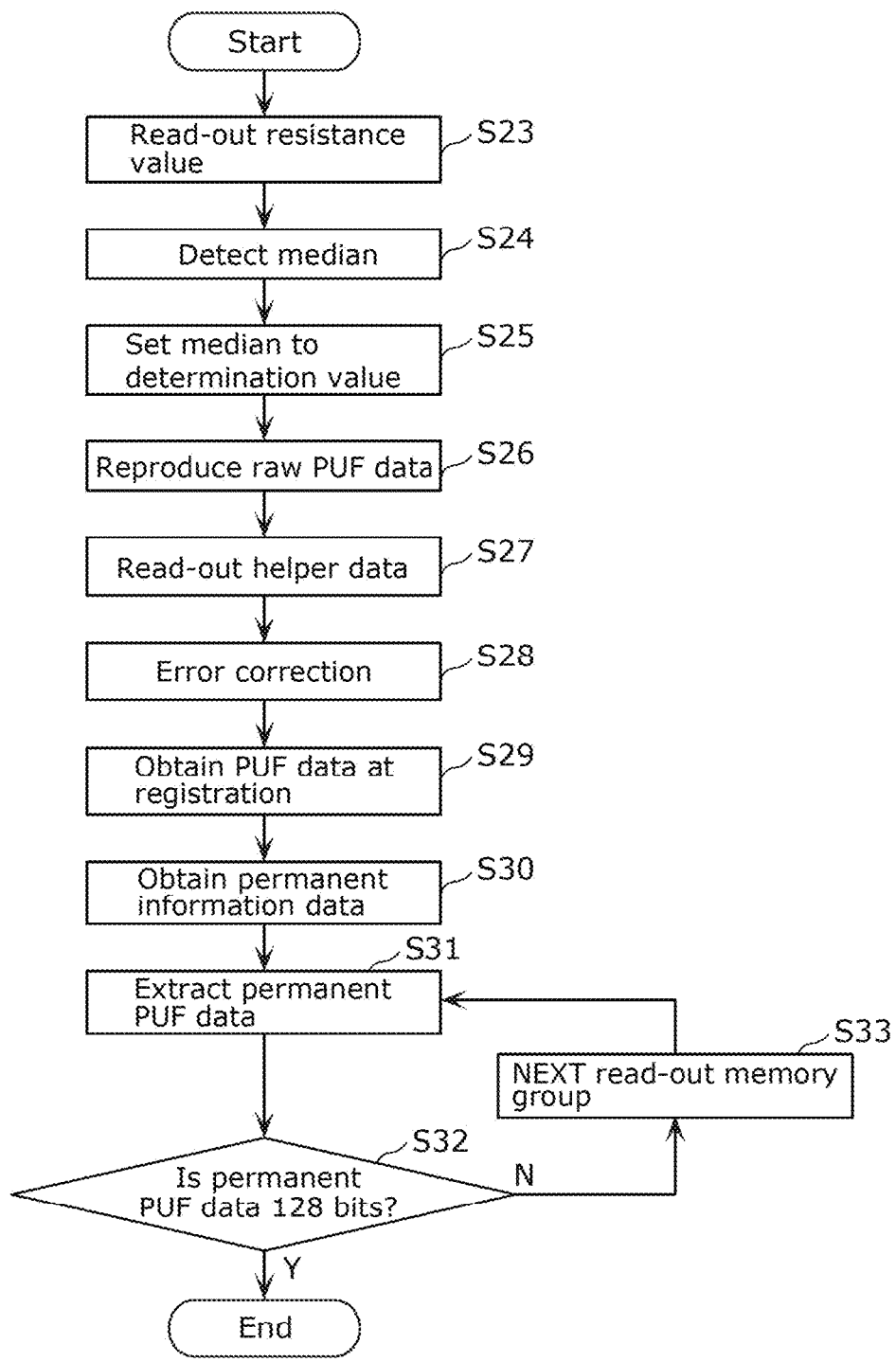
FIG. 19 is a flowchart showing an operation example of the permanent PUF data reproduction mode by the non-volatile memory device in the embodiment.
Figure 20:
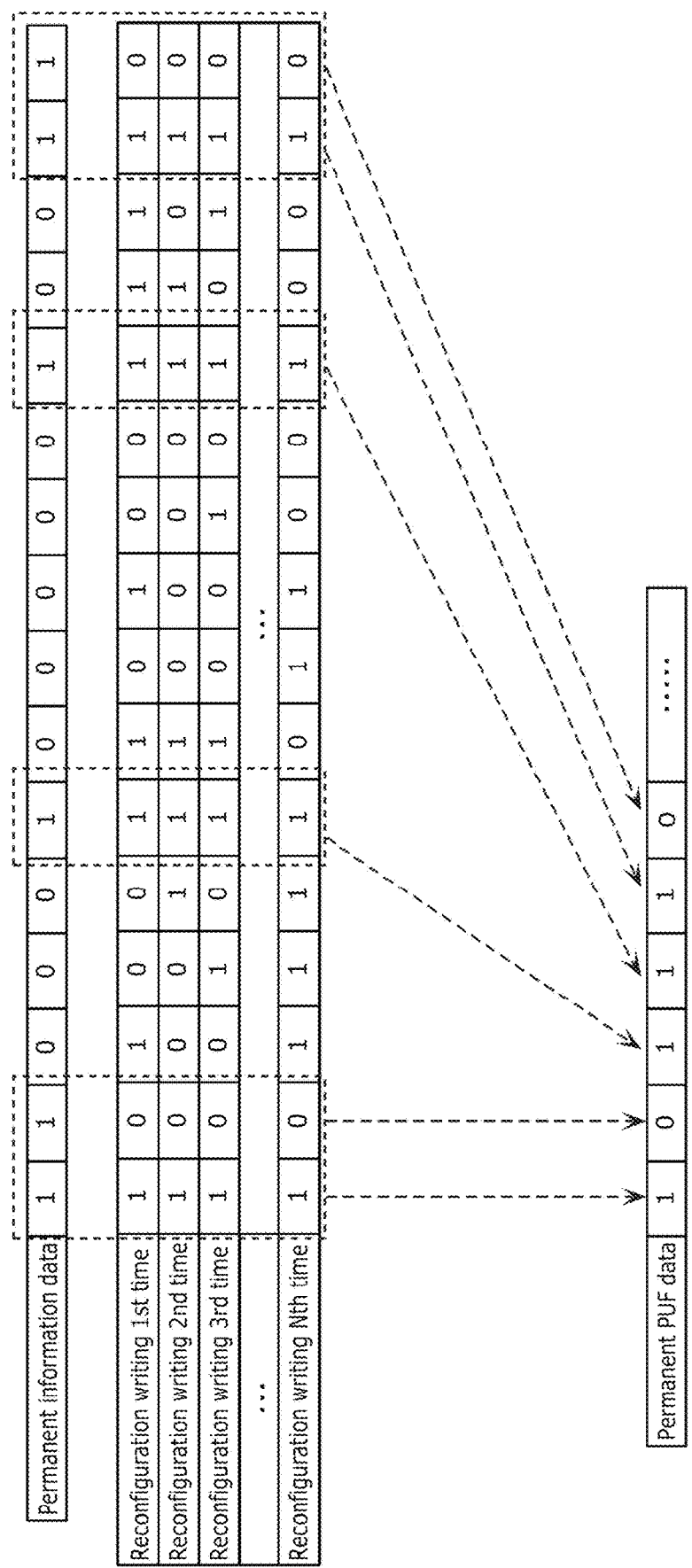
FIG. 20 is a diagram showing an example of generating permanent PUF data by the non-volatile memory device in the embodiment.

Next, the permanent PUF data reproduction mode will be described with reference to FIG. 19 and FIG. 20. FIG. 19 is a flowchart showing an operation example of the permanent PUF data reproduction mode by non-volatile memory device 10 in the present embodiment. FIG. 20 is a diagram showing an example of generating permanent PUF data by non-volatile memory device 10 in the present embodiment.

In FIG. 19, when the second type of challenge data is input to non-volatile memory device 10, the resistance value of each memory cell in PUF area 8 is read out by sense amplifier circuit 30 in step S23. In step S24, the median of the obtained resistance value is detected by determination value setting circuit 13, and then, in step 25, the detected median is output (that is, set) to read-out circuit 12 as a determination value. In step S26, read-out circuit 12 compares the magnitude of the determination value set in step S25 with the resistance value obtained in step S23, and obtains raw PUF data. Subsequently, read-out circuit 12 reads out the helper data stored in information area 7 of the non-volatile memory in step S27, the error correction circuit included in read-out circuit 12 uses the read-out helper data to execute the error correction of the raw PUF data in step S28, and the correct PUF data at the time of PUF data registration is obtained in step S29.

Next, in step S30, read-out circuit 12 reads out the permanent information data generated in the permanent PUF data registration mode and stored in information area 7, and in step S31, as shown in FIG. 20, only the bits assigned as "1" data in the permanent information data are extracted, and the PUF data to be the target bit is taken in order from the upper bit. At this time, even if the reconfiguration writing in the PUF reconfiguration mode is executed once, twice, . . . N times in PUF area 8 before the execution of the permanent PUF reproduction mode, the PUF data does not change for the bits corresponding to 1 in the permanent information data, and a fixed value is always extracted as the permanent PUF data. Since the bits targeted for this permanent PUF data are randomly present in PUF area 8, if a plurality of memory cells read out in parallel by sense amplifier circuit 30 are set as a read-out memory group, a plurality of permanent PUF data may or may not exist in the read-out memory group. That is, in step S32, read-out circuit 12 determines whether the extracted cumulative permanent PUF data has reached 128 bits. If it has not reached 128 bits, the permanent PUF data extraction in the next read-out memory group in PUF area 8 is repeated as in step S33. At the time when the permanent PUF data becomes 128 bits, the operation ends, and the permanent PUF data is obtained as the second response data or the fourth response data.

It should be noted that the permanent PUF data may be extracted with raw PUF data without using error correction by helper data. The factor that causes an error in the PUF data is that the resistance value of the memory cell near the median fluctuates and exceeds the median. However, as in the present embodiment, in the permanent PUF data in which the resistance value near the median is not used, only the resistance value at a location away from the median is adopted, in other words, it can be said that this adopts only the data that is less likely to cause an error.

In addition, in the present embodiment, error correction processing is not performed on the permanent PUF data, but helper data for the permanent PUF data may be generated to perform error correction. In particular, when high reliability is required in a harsh environment such as in-vehicle, it is possible to increase the reliability by storing the helper data of both PUF data and permanent PUF data in information area 7 to perform error correction.

In addition, the helper data of the PUF data may not be stored in information area 7, and only the helper data of the permanent PUF data may be stored in information area 7. When using only permanent PUF data as valid PUF data without using PUF data, the number of bits required for reproduction can be reduced, because the helper data for the PUF data is not stored by registering only the helper data of the permanent PUF data.

As described above, non-volatile memory device 10 according to the present embodiment includes: memory cell array 20 including: a plurality of variable resistance memory cells 21; a data generation circuit (a functional circuit mainly realized by control circuit 15, read-out circuit 12, and determination value setting circuit 13) that generates response data using memory cell array 20 when challenge data is obtained; and a reconfiguration processing circuit (a functional circuit mainly realized by control circuit 15 and writing circuit 14) that executes reconfiguration writing that applies a voltage pulse to memory cell array 20 at least once, wherein the data generation circuit generates: first response data that is unique to non-volatile memory device 10, when a first type of challenge data is obtained (PUF registration mode); second response data that is unique to non-volatile memory device 10, when a second type of challenge data is obtained (permanent PUF registration mode); third response data that is different from the first response data, when the reconfiguration writing is executed by the reconfiguration processing circuit and the first type of challenge data is obtained again after the reconfiguration writing is executed, after the first response data is generated (PUF registration mode); and fourth response data that is identical to the second response data, when the reconfiguration writing is executed by the reconfiguration processing circuit and the second type of challenge data is obtained again after the reconfiguration writing is executed, after the second response data is generated (permanent PUF registration mode).

With this, non-volatile memory device 10 includes a PUF registration mode in which new PUF data is generated by reconfiguration writing and a permanent PUF registration mode in which PUF data that does not change by reconfiguration writing is generated. Therefore, a non-volatile memory device having higher tamper resistance is realized as compared with the conventional non-volatile memory device in which new PUF data is always generated by reconfiguration writing.

In addition, memory cell array 20 includes: a first area (information area 7) including memory cell 21 that holds a resistance value necessary to generate the response data among the plurality of variable resistance memory cells 21; and a second area (PUF area 8) including memory cell 21 that holds information other than the resistance value among the plurality of variable resistance memory cells 21. With this, since one non-volatile memory device 10 is provided with a second area for holding information other than the resistance value used for generating PUF data, non-volatile memory device 10 can be used not only as a PUF data generation device, but also as a general memory for storing various information.

In addition, the data generation circuit includes: a read-out circuit that obtains resistance values from the plurality of variable resistance memory cells 21 included in memory cell array 20; and determination value setting circuit 13 that determines a first determination value from the resistance values obtained, and when the first type of challenge data is obtained, and when the first type of challenge data is obtained again, the data generation circuit generates the first response data and the third response data by comparing the first determination value with the resistance value, respectively. With this, the first determination value used for generating the PUF data can be dynamically determined by determination value setting circuit 13.

In addition, the first determination value is a median of the resistance values of a plurality of predetermined memory cells 21 among the plurality of variable resistance memory cells 21. With this, PUF data is generated by comparing the median with the resistance value of each memory cell, so that the probability that "1" is generated and the probability that "0" is generated are substantially equal, and PUF data with little bias is generated.

In addition, the data generation circuit generates mask data (that is, permanent information data) using a second determination value and a third determination value, the mask data including first data and second data, the second determination value being smaller than the first determination value, the third determination value being larger than the first determination value, the first data being assigned to memory cell 21 having a resistance value which is larger than the second determination value and smaller than the third determination value, the second data being assigned to memory cell 21 having a resistance value which is smaller than the second determination value or larger than the third determination value, and when the second type of challenge data is obtained, the data generation circuit generates the second response data or the fourth response data by comparing the mask data with the first response data or the third response data. With this, in the permanent PUF registration mode, the mask data defined by the resistance value far away from the first determination value is used, so that stable PUF data that is hard to change by the reconfiguration writing is generated.

In addition, memory cell array 20 includes: a first area (information area 7) including memory cell 21 that holds a resistance value necessary to generate the response data, among the plurality of memory cells 21; and a second area (PUF area 8) including a memory cell that stores the mask data among the plurality of memory cells 21. With this, the mask data is stored in the second area included in non-volatile memory device 10, so that it is not necessary to prepare a special storage device other than non-volatile memory device 10 for storing the mask data.

In addition, the plurality of memory cells 21 included in memory cell array 20 have a property of transitioning from a first resistance state to a second resistance state in response to a first writing, and transitioning from the second resistance state to the first resistance state in response to a second writing that is different from the first writing, and the data generation circuit generates the response data using a plurality of memory cells 21 that are set to the first resistance state among the plurality of memory cells 21 in memory cell array 20. With this, PUF data is generated using the resistance values of the memory cells in the same resistance state, so that it becomes more difficult to predict the generated PUF data, and high safety is ensured.

In addition, as the reconfiguration writing, the reconfiguration processing circuit causes memory cell 21 in the first resistance state to transition to the second resistance state by the first writing, and then causes memory cell 21 to transition to the first resistance state by the second writing. With this, even after the reconfiguration writing is performed, the resistance state returns to the same as before the reconfiguration writing is performed, so that it becomes more difficult to predict the PUF data generated before and after the reconfiguration writing, and high safety is ensured.

In addition, the data generation circuit includes an error correction circuit, and performs error correction on the response data. With this, even when the PUF data stored in non-volatile memory device 10 causes a bit error due to long-term storage or the like, the original PUF data can be reproduced by error correction.

In addition, memory cell array 20 includes: a first area (information area 7) including memory cell 21 that holds a resistance value necessary to generate the response data among the plurality of memory cells 21; and a second area (PUF area 8) including memory cell 21 in which a helper data necessary to perform error correction is stored among the plurality of memory cells 21. With this, the helper data used for error correction is stored in the second area of non-volatile memory device 10, so that it is not necessary to prepare a special storage device other than non-volatile memory device 10 for error correction.

In addition, the challenge response method according to the present embodiment is a challenge response method of generating response data corresponding to challenge data by non-volatile memory device 10 that includes memory cell array 20 including a plurality of variable resistance memory cells 21, and the challenge response method includes: generating the response data using memory cell array 20 when the challenge data is obtained; and executing reconfiguration writing in which a voltage pulse is applied to memory cell array 20 at least once, by a reconfiguration processing, wherein the generating includes: generating first response data that is unique to non-volatile memory device 10, when a first type of challenge data is obtained (PUF registration mode); generating second response data that is unique to non-volatile memory device 10, when a second type of challenge data is obtained (permanent PUF registration mode); generating third response data that is different from the first response data, when the reconfiguration writing is executed in the reconfiguration processing and the first type of challenge data is obtained after the reconfiguration writing is executed, after the first response data is generated (PUF registration mode); and generating fourth response data that is identical to the second response data, when the reconfiguration writing is executed in the reconfiguration processing and the second type of challenge data is obtained after the reconfiguration writing is executed, after the second response data is generated (permanent PUF registration mode).

With this, a PUF registration mode in which new PUF data is generated by reconfiguration writing and a permanent PUF registration mode in which PUF data that does not change by reconfiguration writing is generated are realized by non-volatile memory device 10. Therefore, a challenge response method having higher tamper resistance is realized as compared with a conventional non-volatile memory device in which new PUF data is always generated by reconfiguration writing.

Other Embodiments

Although non-volatile memory device 10 and the challenge response method in the embodiment have been described above, the present disclosure is not limited to the above embodiment. Forms obtained by making various modifications to the embodiment that can be conceived by those skilled in the art, as well as other forms constructed by combining parts of structural components in the embodiment, without departing from the spirit of the present disclosure, are also included in the scope of the present disclosure.

For example, in the above embodiment, the generated helper data does not necessarily have to be stored in information area 7, and may be stored in a server or an external recording medium.

In addition, the control signals for controlling the PUF registration mode, PUF reproduction mode, PUF reconfiguration mode, permanent PUF registration mode, and permanent PUF data reproduction mode described in the above embodiment may be executed by a computer (computer system). Then, they can be realized as a program to be executed by a computer. Furthermore, the present disclosure can be realized as a non-temporary computer-readable recording medium which is a CD-ROM or the like on which the program is recorded.

For example, when the present disclosure is realized by a program (software), each step is executed by executing the program using hardware resources such as a CPU, memory, and input/output circuit of a computer. That is, each step is executed by the CPU obtaining data from the memory, the input/output circuit, or the like and performs an operation, or outputting the operation result to the memory, the input/output circuit, or the like.

In addition, each component included in non-volatile memory device 10 in the above embodiment may be realized as a dedicated or general-purpose circuit.

In addition, each component included in non-volatile memory device 10 in the above embodiment may be realized as a large scale integration (LSI) which is an integrated circuit (IC).

In addition, the integrated circuit is not limited to the LSI, and may be realized by a dedicated circuit or a general-purpose processor. A programmable field programmable gate array (FPGA) or a reconfigurable processor in which the connection and settings of circuit cells inside the LSI can be reconfigured may be used.

Furthermore, if an integrated circuit technology that replaces an LSI appears due to advances in semiconductor technology or another technology derived therefrom, it is natural that each component included in non-volatile memory device 10 may be integrated using that technology.

It should be noted that from the above description, many improvements and other embodiments of the present disclosure will be apparent to those skilled in the art. Therefore, the above description should be construed as an example only and is provided for the purpose of teaching those skilled in the art the best aspects embodying the present disclosure. The details of its structure and/or function can be substantially changed without departing from the spirit of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be used as a non-volatile memory device with tamper resistance and a challenge response method using a non-volatile memory device, for example, as an encryption key generating device used for an electronic commerce service performed via the Internet such as online banking and online shopping.

The invention claimed is:

1. A non-volatile memory device, comprising:
a memory cell array including a plurality of variable resistance memory cells;
a data generation circuit that generates response data using the memory cell array when challenge data is obtained; and
a reconfiguration processing circuit that executes reconfiguration writing that applies a voltage pulse to the memory cell array at least once,
wherein the data generation circuit generates:
first response data that is unique to the non-volatile memory device, when a first type of challenge data is obtained;
second response data that is unique to the non-volatile memory device, when a second type of challenge data is obtained;
third response data that is different from the first response data, when the reconfiguration writing is executed by the reconfiguration processing circuit and the first type of challenge data is obtained again after the reconfiguration writing is executed, after the first response data is generated; and
fourth response data that is identical to the second response data, when the reconfiguration writing is executed by the reconfiguration processing circuit and the second type of challenge data is obtained again after the reconfiguration writing is executed, after the second response data is generated.

2. The non-volatile memory device according to claim 1, wherein the memory cell array includes:
a first area including a memory cell that holds a resistance value necessary to generate the response data among the plurality of variable resistance memory cells; and
a second area including a memory cell that holds information other than the resistance value among the plurality of variable resistance memory cells.

3. The non-volatile memory device according to claim 1, wherein the data generation circuit includes:
a read-out circuit that obtains resistance values from the plurality of variable resistance memory cells included in the memory cell array; and
a determination value setting circuit that determines a first determination value from the resistance values obtained, and when the first type of challenge data is obtained, and when the first type of challenge data is obtained again, the data generation circuit generates the first response data and the third response data by comparing the first determination value with the resistance value, respectively.

4. The non-volatile memory device according to claim 3, wherein the first determination value is a median of resistance values of a plurality of predetermined memory cells among the plurality of variable resistance memory cells.

5. The non-volatile memory device according to claim 3, wherein the data generation circuit generates mask data using a second determination value and a third determination value, the mask data including first data and second data, the second determination value being smaller than the first determination value, the third determination value being larger than the first determination value, the first data being assigned to a memory cell having a resistance value which is larger than the second determination value and smaller than the third determination value, the second data being assigned to a memory cell having a resistance value which is smaller than the second determination value or larger than the third determination value, and when the second type of challenge data is obtained, the data generation circuit generates the second response data or the fourth response data by comparing the mask data with the first response data or the third response data.

6. The non-volatile memory device according to claim 5, wherein the memory cell array includes:
a first area including a memory cell that holds a resistance value necessary to generate the response data among the plurality of memory cells; and
a second area including a memory cell that stores the mask data among the plurality of memory cells.

7. The non-volatile memory device according to claim 1, wherein the plurality of variable resistance memory cells included in the memory cell array have a property of transitioning from a first resistance state to a second resistance state in response to a first writing, and transitioning from the second resistance state to the first resistance state in response to a second writing that is different from the first writing, and
the data generation circuit generates the response data using a plurality of memory cells that are set to the first resistance state among the plurality of memory cells in the memory cell array.

8. The non-volatile memory device according to claim 7, wherein as the reconfiguration writing, the reconfiguration processing circuit causes a memory cell in the first resistance state to transition to the second resistance state by the first writing, and then causes the memory cell to transition to the first resistance state by the second writing.

9. The non-volatile memory device according to claim 1, wherein the data generation circuit includes an error correction circuit, and performs error correction on the response data.

10. The non-volatile memory device according to claim 9, wherein the memory cell array includes:
a first area including a memory cell that holds a resistance value necessary to generate the response data among the plurality of memory cells; and a second area including a memory cell in which a helper data necessary to perform error correction is stored among the plurality of memory cells.

11. A challenge response method of generating response data corresponding to challenge data by a non-volatile memory device that includes a memory cell array including a plurality of variable resistance memory cells, the challenge response method comprising:

generating the response data using the memory cell array when the challenge data is obtained; and performing reconfiguration processing to execute reconfiguration writing in which a voltage pulse is applied to the memory cell array at least once, wherein the generating includes:

generating first response data that is unique to the non-volatile memory device, when a first type of challenge data is obtained;

generating second response data that is unique to the non-volatile memory device, when a second type of challenge data is obtained;

generating third response data that is different from the first response data, when the reconfiguration writing is executed in the reconfiguration processing and the first type of challenge data is obtained after the reconfiguration writing is executed, after the first response data is generated; and generating fourth response data that is identical to the second response data, when the reconfiguration writing is executed in the reconfiguration processing and the second type of challenge data is obtained after the reconfiguration writing is executed, after the second response data is generated.

* * * * *